(12) United States Patent
Li et al.

(10) Patent No.: US 9,761,696 B2
(45) Date of Patent: Sep. 12, 2017

(54) SELF-ALIGNED TRENCH MOSFET AND METHOD OF MANUFACTURE

(71) Applicant: Vishay-Siliconix, Santa Clara, CA (US)

(72) Inventors: Jian Li, Palo Alto, CA (US); Kuo-In Chen, Los Altos, CA (US); Kyle Terril, Santa Clara, CA (US)

(73) Assignee: Vishay-Siliconix, Santa Clara, CA (US)

( * ) Notice: Subject to any disclaimer, the term of this patent is extended or adjusted under 35 U.S.C. 154(b) by 0 days.

(21) Appl. No.: 14/221,012

(22) Filed: Mar. 20, 2014

(65) Prior Publication Data

US 2014/0206165 A1    Jul. 24, 2014

Related U.S. Application Data

(62) Division of application No. 12/015,723, filed on Jan. 17, 2008, now abandoned.

(Continued)

(51) Int. Cl.
  *H01L 21/336* (2006.01)
  *H01L 29/66* (2006.01)
  (Continued)

(52) U.S. Cl.
  CPC .... *H01L 29/66734* (2013.01); *H01L 29/1095* (2013.01); *H01L 29/41766* (2013.01);
  (Continued)

(58) Field of Classification Search
  CPC .......... H01L 29/1095; H01L 29/41766; H01L 29/66719; H01L 29/66734; H01L 29/66727; H01L 29/7813
  (Continued)

(56) References Cited

U.S. PATENT DOCUMENTS 3,906,540 A    9/1975    Hollins
4,641,174 A    2/1987    Baliga
(Continued)

FOREIGN PATENT DOCUMENTS

CN    101180737       5/2008
DE    4 208 695 A1    9/1992
(Continued)

OTHER PUBLICATIONS

Masakatsu Hoshi et al., "A DMOSFET Having A Cell Array Field Ring for Improving Avalanche Capability", May 18, 1993, IEEE, Proceedings of the 5th International Symposium on Power Semiconductor Devices and ICs (ISPSD), Monterey, California, May 18-20, 1993, pp. 141-145, XP000380145.
(Continued)

*Primary Examiner* — Laura Menz
*Assistant Examiner* — Candice Y Chan (57) ABSTRACT

A trench metal-oxide-semiconductor field effect transistor (MOSFET), in accordance with one embodiment, includes a drain region, a plurality of gate regions disposed above the drain region, a plurality of gate insulator regions each disposed about a periphery of a respective one of the plurality of gate regions, a plurality of source regions disposed in recessed mesas between the plurality of gate insulator regions, a plurality of body regions disposed in recessed mesas between the plurality of gate insulator regions and between the plurality of source regions and the drain region. The MOSFET also includes a plurality of body contact regions disposed in the each body region adjacent the plurality of source regions, a plurality of source/body contact spacers disposed between the plurality of gate insulator regions above the recessed mesas, a source/body contact disposed above the source/body contact spacers, and a plurality of source/body contact, plugs disposed between the (Continued)

source/body contact spacers and coupling the source/body contact to the plurality of body contact regions and the plurality of source regions.

6 Claims, 13 Drawing Sheets

Related U.S. Application Data (60) Provisional application No. 60/921,792, filed on Apr. 3, 2007.

(51) Int. Cl.
    *H01L 29/10* (2006.01)
    *H01L 29/417* (2006.01)
    *H01L 29/78* (2006.01)
    H01L 29/45 (2006.01)
    H01L 29/49 (2006.01)

(52) U.S. Cl.
    CPC .. *H01L 29/66719* (2013.01); *H01L 29/66727* (2013.01); *H01L 29/7813* (2013.01); H01L 29/456 (2013.01); H01L 29/4925 (2013.01); H01L 29/4933 (2013.01)

(58) Field of Classification Search
    USPC .......................................................... 438/27
    See application file for complete search history.

(56) References Cited

U.S. PATENT DOCUMENTS

| | | |
|---|---|---|
| 4,672,407 A | 6/1987 | Nakagawa et al. |
| 4,782,372 A | 11/1988 | Nakagawa et al. |
| 4,799,095 A | 1/1989 | Baliga |
| 4,823,172 A | 4/1989 | Mihara |
| 4,827,321 A | 5/1989 | Baliga |
| 4,857,986 A | 8/1989 | Kinugawa |
| 4,893,160 A | 1/1990 | Blanchard |
| 4,928,155 A | 5/1990 | Nakagawa et al. |
| 4,939,557 A | 7/1990 | Pao et al. |
| 4,967,243 A | 10/1990 | Baliga et al. |
| 4,969,027 A | 11/1990 | Baliga et al. |
| 5,021,840 A | 6/1991 | Morris |
| 5,055,896 A | 10/1991 | Williams et al. |
| 5,072,266 A | 12/1991 | Bulucea et al. |
| 5,111,253 A | 5/1992 | Korman et al. |
| 5,168,331 A | 12/1992 | Yilmaz |
| 5,191,395 A | 3/1993 | Nishimura |
| 5,221,850 A | 6/1993 | Sakurai |
| 5,233,215 A | 8/1993 | Baliga |
| 5,245,106 A | 9/1993 | Cameron et al. |
| 5,366,914 A | 11/1994 | Takahashi et al. |
| 5,378,655 A | 1/1995 | Hutchings et al. |
| 5,387,528 A | 2/1995 | Hutchings et al. |
| 5,430,315 A | 7/1995 | Rumennik |
| 5,525,821 A | 6/1996 | Harada et al. |
| 5,527,720 A | 6/1996 | Goodyear et al. |
| 5,567,634 A | 10/1996 | Hebert et al. |
| 5,578,508 A | 11/1996 | Baba et al. |
| 5,602,424 A | 2/1997 | Tsubouchi et al. |
| 5,621,234 A | 4/1997 | Kato |
| 5,648,283 A | 7/1997 | Tsang et al. |
| 5,689,128 A | 11/1997 | Hshieh |
| 5,696,396 A | 12/1997 | Tokura et al. |
| 5,770,878 A | 6/1998 | Beasom |
| 5,808,340 A | 9/1998 | Wollesen et al. |
| 5,814,858 A | 9/1998 | Williams |
| 5,877,538 A | 3/1999 | Williams |
| 5,965,904 A | 10/1999 | Ohtani et al. |
| 5,998,836 A | 12/1999 | Williams |
| 5,998,837 A | 12/1999 | Williams |
| 6,049,108 A | 4/2000 | Williams et al. |
| 6,096,584 A | 8/2000 | Ellis-Monaghan et al. |
| 6,140,678 A | 10/2000 | Grabowski et al. |
| 6,153,896 A | 11/2000 | Omura et al. |
| 6,168,996 B1 | 1/2001 | Numazawa et al. |
| 6,172,398 B1 | 1/2001 | Hshieh |
| 6,180,966 B1 | 1/2001 | Kohno et al. |
| 6,204,533 B1 | 3/2001 | Williams et al. |
| 6,211,018 B1 | 4/2001 | Nam et al. |
| 6,238,981 B1 | 5/2001 | Grebs |
| 6,245,615 B1 | 6/2001 | Noble et al. |
| 6,268,242 B1 | 7/2001 | Williams et al. |
| 6,277,695 B1 | 8/2001 | Williams et al. |
| 6,285,060 B1 | 9/2001 | Korec et al. |
| 6,323,518 B1 | 11/2001 | Sakamoto et al. |
| 6,348,712 B1 | 2/2002 | Korec et al. |
| 6,351,009 B1 | 2/2002 | Kocon et al. |
| 6,359,308 B1 | 3/2002 | Hijzen et al. |
| 6,391,721 B2 | 5/2002 | Nakagawa |
| 6,413,822 B2 | 7/2002 | Williams et al. |
| 6,483,171 B1 | 11/2002 | Forbes et al. |
| 6,489,204 B1 | 12/2002 | Tsui |
| 6,495,883 B2 | 12/2002 | Shibata et al. |
| 6,498,071 B2 | 12/2002 | Hijzen et al. |
| 6,580,123 B2 | 6/2003 | Thapar |
| 6,580,154 B2 | 6/2003 | Noble et al. |
| 6,642,109 B2 | 11/2003 | Lee et al. |
| 6,661,054 B1 | 12/2003 | Nakamura |
| 6,700,158 B1 | 3/2004 | Cao et al. |
| 6,710,403 B2 | 3/2004 | Sapp |
| 6,717,210 B2 | 4/2004 | Takano et al. |
| 6,756,274 B2 | 6/2004 | Williams et al. |
| 6,764,889 B2 | 7/2004 | Baliga |
| 6,770,539 B2 | 8/2004 | Sumida |
| 6,825,105 B2 | 11/2004 | Grover et al. |
| 6,861,701 B2 | 3/2005 | Williams et al. |
| 6,903,393 B2 | 6/2005 | Ohmi et al. |
| 6,919,610 B2 | 7/2005 | Saitoh et al. |
| 6,927,455 B2 | 8/2005 | Narazaki |
| 6,960,821 B2 | 11/2005 | Noble et al. |
| 6,987,305 B2 | 1/2006 | He et al. |
| 7,224,022 B2 | 5/2007 | Tokano et al. |
| 7,361,952 B2 | 4/2008 | Miura et al. |
| 7,375,029 B2 | 5/2008 | Poelzl |
| 7,397,083 B2 | 7/2008 | Amali et al. |
| 7,449,354 B2 | 11/2008 | Marchant et al. |
| 7,521,306 B2 | 4/2009 | Kubo et al. |
| 7,541,642 B2 | 6/2009 | Kawamura et al. |
| 7,544,568 B2 | 6/2009 | Matsuura et al. |
| 7,652,325 B2 | 1/2010 | Siemieniec et al. |
| 7,663,195 B2 | 2/2010 | Ohmi et al. |
| RE41,509 E | 8/2010 | Kinzer et al. |
| 7,910,440 B2 | 3/2011 | Ohta et al. |
| 7,910,486 B2 | 3/2011 | Yilmaz et al. |
| 7,964,913 B2 | 6/2011 | Darwish |
| 8,080,459 B2 | 12/2011 | Xu |
| 8,367,500 B1 | 2/2013 | Xu et al. |
| 8,629,019 B2 | 1/2014 | Xu et al. |
| 2001/0026006 A1 | 10/2001 | Noble et al. |
| 2001/0026989 A1 | 10/2001 | Thapar |
| 2002/0036319 A1 | 3/2002 | Baliga |
| 2002/0038887 A1 | 4/2002 | Ninomiya et al. |
| 2002/0050847 A1 | 5/2002 | Taniguchi et al. |
| 2002/0074585 A1 | 6/2002 | Tsang et al. |
| 2002/0123196 A1 | 9/2002 | Chang et al. |
| 2002/0130359 A1 | 9/2002 | Okumura et al. |
| 2003/0030092 A1 | 2/2003 | Darwish et al. |
| 2003/0201483 A1 | 10/2003 | Sumida |
| 2004/0016959 A1 | 1/2004 | Yamaguchi et al. |
| 2004/0021174 A1 | 2/2004 | Kobayashi |
| 2004/0155287 A1 | 8/2004 | Omura et al. |
| 2004/0161886 A1 | 8/2004 | Forbes et al. |
| 2004/0173844 A1 | 9/2004 | Williams et al. |
| 2005/0001268 A1 | 1/2005 | Baliga |
| 2005/0026369 A1 | 2/2005 | Noble et al. |
| 2005/0029585 A1 | 2/2005 | He et al. |
| 2005/0079678 A1 | 4/2005 | Verma et al. |
| 2005/0167695 A1 | 8/2005 | Yilmaz |
| 2005/0167698 A1 | 8/2005 | Hisaka |
| 2005/0184336 A1 | 8/2005 | Takahashi |
| 2005/0266642 A1 | 12/2005 | Kubo et al. |

(56) References Cited

U.S. PATENT DOCUMENTS

| | | |
|---|---|---|
| 2006/0014349 A1 | 1/2006 | Williams et al. |
| 2006/0108635 A1 | 5/2006 | Bhalla et al. |
| 2006/0113577 A1 | 6/2006 | Ohtani |
| 2006/0113588 A1 | 6/2006 | Wu |
| 2006/0226494 A1 | 10/2006 | Hshieh |
| 2006/0267090 A1 | 11/2006 | Sapp et al. |
| 2006/0273383 A1 | 12/2006 | Hshieh |
| 2006/0285368 A1 | 12/2006 | Schlecht |
| 2007/0007589 A1 | 1/2007 | Nakagawa |
| 2007/0013000 A1 | 1/2007 | Shiraishi |
| 2007/0023828 A1 | 2/2007 | Kawamura et al. |
| 2007/0138546 A1 | 6/2007 | Kawamura et al. |
| 2007/0155104 A1 | 7/2007 | Marchant et al. |
| 2007/0228496 A1 | 10/2007 | Rochefort et al. |
| 2007/0249142 A1 | 10/2007 | Hisanaga |
| 2008/0099344 A9 | 5/2008 | Basol et al. |
| 2008/0135931 A1 | 6/2008 | Challa et al. |
| 2008/0164515 A1 | 7/2008 | Li |
| 2008/0164517 A1 | 7/2008 | Ohta et al. |
| 2008/0173969 A1 | 7/2008 | Hebert et al. |
| 2008/0185640 A1 | 8/2008 | Nakagawa |
| 2008/0246081 A1 | 10/2008 | Li et al. |
| 2009/0140327 A1 | 6/2009 | Hirao et al. |
| 2009/0159963 A1 | 6/2009 | Yamaguchi et al. |
| 2009/0166740 A1 | 7/2009 | Bhalla et al. |
| 2010/0055892 A1 | 3/2010 | Poelzl |
| 2010/0059797 A1 | 3/2010 | Ngai et al. |
| 2010/0078718 A1 | 4/2010 | Blank et al. |
| 2010/0181606 A1 | 7/2010 | Takaishi |
| 2011/0049614 A1 | 3/2011 | Gao et al. |
| 2011/0053326 A1 | 3/2011 | Gao et al. |
| 2011/0089486 A1 | 4/2011 | Xu et al. |
| 2012/0187474 A1 | 7/2012 | Rexer et al. |
| 2012/0313161 A1 | 12/2012 | Grivna et al. |
| 2012/0326229 A1 | 12/2012 | Poelzl et al. |
| 2014/0206165 A1 | 7/2014 | Li et al. |
| 2015/0108568 A1 | 4/2015 | Terrill et al. |

FOREIGN PATENT DOCUMENTS

| | | |
|---|---|---|
| DE | 102004036330 | 3/2005 |
| DE | 112005003584 | 4/2008 |
| EP | 0 133 642 A1 | 3/1985 |
| EP | 0354449 | 2/1990 |
| EP | 0 438 700 A1 | 7/1991 |
| EP | 0 583 022 A2 | 2/1994 |
| EP | 0 583 028 A1 | 2/1994 |
| EP | 0620588 | 10/1994 |
| EP | 0628337 | 12/1994 |
| EP | 0 746 030 A2 | 12/1996 |
| EP | 1 033 759 A2 | 9/2000 |
| EP | 1186023 | 3/2002 |
| EP | 1351313 | 10/2003 |
| EP | 1376674 | 1/2004 |
| EP | 1403914 | 3/2004 |
| GB | 2 269 050 A | 1/1994 |
| JP | 62-298152 | 12/1987 |
| JP | H03-173180 | 7/1991 |
| JP | H05315620 | 11/1993 |
| JP | H06350090 A | 12/1994 |
| JP | H09-129877 | 5/1997 |
| JP | H09260645 | 10/1997 |
| JP | H10-032331 | 2/1998 |
| JP | H0214809 | 8/1998 |
| JP | 2000-091344 | 3/2000 |
| JP | 2000332246 | 11/2000 |
| JP | 2001-016080 | 1/2001 |
| JP | 2002016080 | 1/2002 |
| JP | 2002110978 | 4/2002 |
| JP | 2002-134705 | 5/2002 |
| JP | 2002-190593 | 7/2002 |
| JP | 2002-246596 | 8/2002 |
| JP | 2002222950 | 8/2002 |
| JP | 2002-368221 | 12/2002 |
| JP | 2002-373988 | 12/2002 |
| JP | 2003030396 | 1/2003 |
| JP | 2003515954 | 5/2003 |
| JP | 2003324196 | 11/2003 |
| JP | 2004-134793 | 4/2004 |
| JP | 2004522319 | 7/2004 |
| JP | 2005-142240 | 6/2005 |
| JP | 2005524970 | 8/2005 |
| JP | 2005-268679 | 9/2005 |
| JP | 2006-339558 | 12/2006 |
| JP | 2007027561 | 2/2007 |
| JP | 2007-158275 | 6/2007 |
| JP | 2007-189192 | 7/2007 |
| JP | 2008042056 | 2/2008 |
| JP | 2008-511982 | 4/2008 |
| JP | 2008-171887 | 7/2008 |
| JP | 2009-004411 | 1/2009 |
| JP | 2009-043966 | 2/2009 |
| JP | 2009-522807 | 6/2009 |
| KR | 10-0714198 | 5/2007 |
| TW | 490853 | 6/2002 |
| TW | 200507237 | 2/2005 |
| WO | 0065646 | 11/2000 |
| WO | 01/41206 | 6/2001 |
| WO | 0199177 | 12/2001 |
| WO | 03010812 | 2/2003 |
| WO | 2004105116 | 12/2004 |
| WO | 2006025035 | 3/2006 |
| WO | 2006058210 | 6/2006 |
| WO | 2006126998 | 11/2006 |
| WO | 2007002857 | 1/2007 |
| WO | 2008156071 | 12/2008 |

OTHER PUBLICATIONS

"Effects on Selecting Channel Direction in Improving Performance of Sub-100 nm MOSFETs Fabricated on (110) Surface Si Substrate" Japanese Journal of Applied Physics, Part 1, vol. 43, No. 4B, Apr. 2004 pp. 1723-1728 (Nakamura et al.), XP00122768.

Hattori, et al. Design of a 200V Super Junction MOSFET With N-Buffer Regions and Its Fabrication by Trench Filling; Proceedings of 2004 International Symposium on Power Semiconductor Devices & ICS, Kitakyusus; 2004.

Y. C. Pao et al., "(110)-Oriented GaAs MESFET's", IEEE Electron Device Letters, vol. 9, No. 3, pp. 119-121, Mar. 1988.

L. Parechanian-Allen et al., "Device Quality Growth and Characterization of (110) GaAs Grown by Molecular Beam Epitaxy", submitted to Applied Physics Letters, Nov. 1986, Lawrence Berkeley Laboratory University of California, Berkeley, California, LBL-22564.

L. Parechanian-Allen et al., "Surface Faceting of (110) GaAs: Analysis and Elimination", presented at the Material Research Society Fall Conference, Session I, Boston, MA, Dec. 1, 1986, Lawrence Berkeley Laboratory University of California, Berkeley, California, LBL-22577.

SELF-ALIGNED TRENCH MOSFET AND METHOD OF MANUFACTURE

CROSS-REFERENCE TO RELATED APPLICATIONS

This application is a divisional of U.S. patent application Ser. No. 12/015,723 filed Jan. 17, 2008, which claims the benefit of U.S. Provisional Application No. 60/921,792 filed Apr. 3, 2007, all of which are incorporated herein by reference.

BACKGROUND OF THE INVENTION

To reduce the drain-to-source on-resistance (Rdson) in power metal-oxide-semiconductor field effect transistors (MOSFET), numerous novel structures have been proposed and implemented. In trench based MOSFETs, shrinking the lateral pitch to increase cell density has been used to effectively reduce Rdson of the multi-cell MOSFETs. However, the ability to shrink the pitch below 1 micrometer (um) has been limited by source contact alignment errors, even when deep-ultraviolet (DUV) photolithography is used. Accordingly, there is a continued need to further reduce the Rdson of MOSFETs and improved techniques for fabricating such MOSFETs.

SUMMARY OF THE INVENTION

Embodiments of the present technology provide an improved trench metal-oxide-semiconductor field effect transistor (MOSFET). More specifically, embodiments of the present invention provide a trench MOSFET including a drain region, a plurality of gate regions disposed above the drain region, a plurality of gate insulator regions disposed about a periphery of a respective one of the plurality of gate regions, a field insulator region disposed above the gate region, a plurality of source regions disposed along the surface of the body region proximate a periphery of the gate insulator region. A plurality of source/body contact spacers are disposed in recessed mesas above the plurality of source regions and between the gate insulator regions. The recessed mesas are formed by a first silicon etch self-aligned to the field insulator region. A plurality of source/body contact plugs are disposed through the source/body contact spacers and the plurality of source regions between the gate insulator regions. A plurality of source/body contact implants are disposed in the body region proximate the source/body contacts. The source/body contacts implants are formed by an implant self-aligned to the plurality of source body contact spacers Embodiments of the present technology also provide a method of fabricating a trench MOSFET that includes depositing a first semiconductor layer upon a semiconductor substrate, wherein the first semiconductor layer and the semiconductor substrate are doped with a first type of impurity. A first portion of the first semiconductor layer is doped with a second type of impurity. A plurality of trenches are etched in the first semiconductor layer. A first dielectric layer is formed on the wall of the plurality of trenches. A second semiconductor layer is deposited in the plurality of trenches. A second dielectric layer is formed over the second semiconductor layer in the plurality of trenches. Recessed mesas are etched in the first semiconductor layer and are self-aligned by the second dielectric layer in the plurality of trenches. A second portion of the first semiconductor layer proximate the recessed mesas is doped with a second type of impurity. A plurality of source/body contact spacers are formed in the recessed mesas self-aligned by the second dielectric layer in the trenches. A plurality of source/body contact trenches are etched between the source/body contact spacers. The source body contact trenches extend through the second portion of the first semiconductor layer. A third portion of the first semiconductor layer proximate the source/body contact trenches is doped with the first type of impurity self-aligned by the source/body contact spacers. A first metal layer is deposited in the source/body contact trenches.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Figure 1:
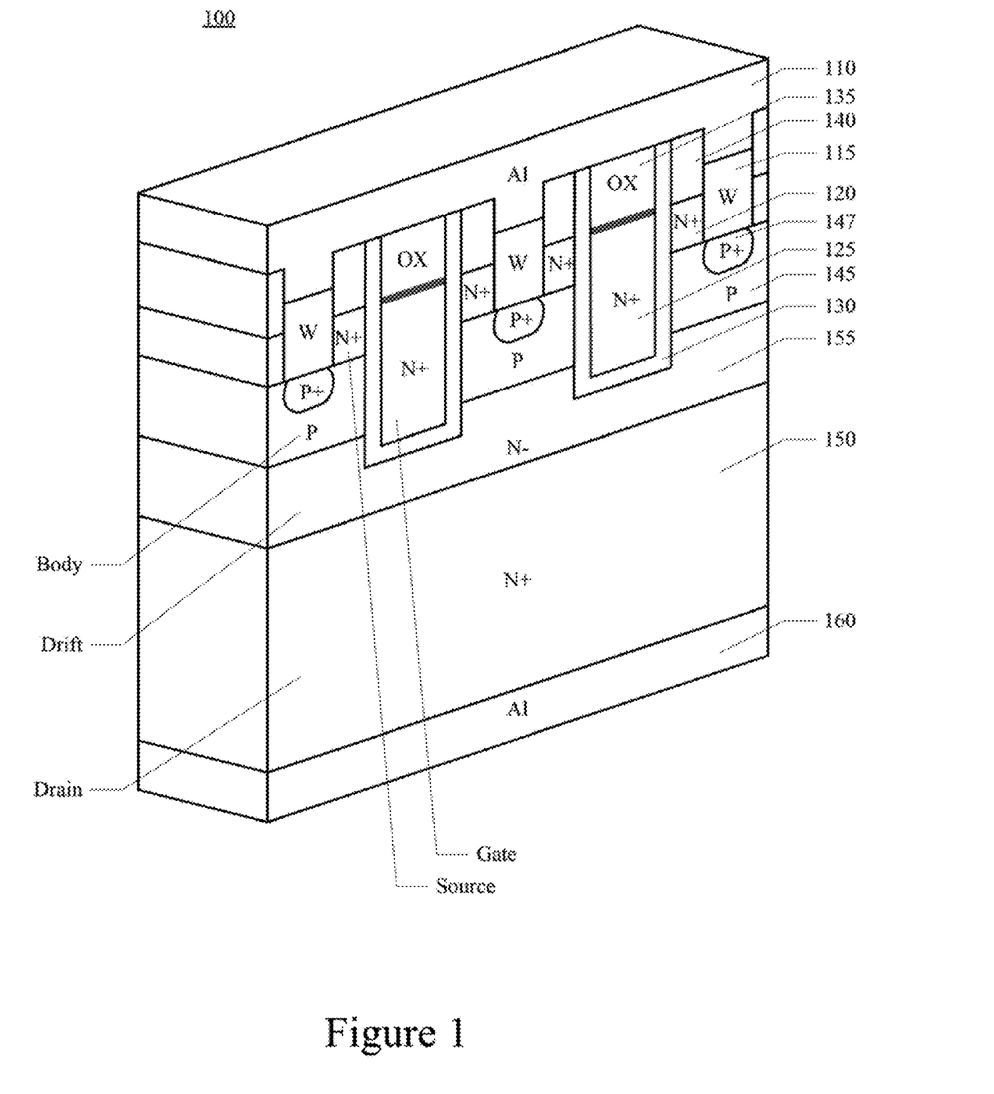
FIG. 1 shows a cross sectional perspective view of a trench MOSFET, in accordance with one embodiment of the present technology.

Referring to FIG. 1, a cross sectional perspective view of a trench metal-oxide-semiconductor field effect transistor (MOSFET) 100, in accordance with one embodiment of the present technology, is shown. The trench MOSFET 100 comprises a source/body contact 110, a plurality of source/body contact plugs 115, a plurality of source regions 120, a plurality of gate regions 125, a plurality of gate insulator regions 130, a plurality of field dielectric regions 135, a plurality of source/body contact spacers 140, a plurality of body regions 145, a plurality of body contact regions 147, a drain region 150, 155 and drain contact 160. The drain region 150, 155 may optionally include a first drain portion 150 and a second drain portion 155, which are conventionally referred to as a drain region and a drift region respectively.

The body regions 145 are disposed above the drain region 150, 155. The source regions 120, gate regions 125 and the gate insulator regions 130 are disposed within the body regions 145. The gate regions 125 and the gate insulator regions 130 may be formed as parallel-elongated structures in as striped cell implementation. The gate insulator region 130 surrounds the gate regions 125. The field dielectric regions 135 are disposed above the gate regions 125. Thus, the gate regions 125 are electrically isolated from the surrounding regions b the gate insulator regions 130 and field dielectric regions 135. The gate regions 125 are coupled to form a common gate of the device 100. The source regions 120 are formed as parallel-elongated structures along the periphery of the gate insulator regions 130. The source/body contact 110 is coupled to the source regions 120 and the body regions 145 by the source/body contact plugs 125.

In another implementation, the gate region 125 may include a first portion formed as a first plurality of substantially parallel elongated structures and a second portion formed as a second plurality of substantially elongated structures that are substantially perpendicular to the first plurality of substantially parallel elongated structures. The gate insulator region 130 is disposed about a periphery of the gate region 125. Accordingly, the gate insulator region 130 is also formed as a first plurality of substantially parallel elongated structures and a second portion formed as a second plurality of substantially elongated structures that are substantially perpendicular to the first plurality of substantially parallel elongated structures.

The plurality of source/body contact spacers 140 are disposed in recessed mesas above the plurality of source regions 120 and between the gate insulator regions 125. The recessed mesas are formed be a first silicon etch that is self-aligned to the field insulator region 135 and gate oxide region 130. The plurality of source/body contact plugs 115 are disposed through the source/body contact spacers 140 and the plurality of source regions 120. The plurality of body contact regions 147 are disposed in the body regions 145 proximate the source/body contact plugs 115. The body contact regions 147 are formed by an implant self-aligned by the plurality of source body contact spacers 140.

In an exemplary implementation, the source regions 120 and the drain region 150 may be heavily n-doped (N+) semiconductor, such as silicon doped with phosphorous or arsenic. The body regions 145 may be p-doped (P) semiconductor, such as silicon doped with boron. The gate region 125 may be heavily n-doped (N+) semiconductor, such as polysilicon doped with phosphorous. The gate insulator regions 130 may be an insulator, such as silicon dioxide. The source contact 110 and drain contact may be copper (Cu), aluminum (Al), a multilayer metal or the like.

When the potential of the gate regions 125, with respect to the source regions 120, is increased above the threshold voltage of the device 100, a conducting channel is induced in the body region 145 along the periphery of the gate insulator regions 120. The trench MSOFET 100 will then conduct current between the drain region 150 and the source regions 120. Accordingly, the device will be in its on state.

When the potential of the gate regions 125 is reduced below the threshold voltage, the channel is no longer induced. As a result, a voltage potential applied between the drain region 150 and the source regions 120 will not cause current to flow there between. Accordingly, the device 100 will be in its off state and the junction formed by the body region 145 and the drain region 150 supports the voltage applied across the source and drain.

If the drain region 150, 155 comprises a second drain portion 155 disposed above a first drain portion 150, the second portion of the drain region 155 may be lightly n-doped (N−) semiconductor, such as silicon doped with phosphorous or arsenic, and the first portion of the drain region 150 may be heavily n-doped (N+) semiconductor, such as silicon doped with phosphorous or arsenic. The lightly n-doped (N−) second portion of the drain region 155 results in a depletion region that extends into both the body regions 145 and the second portion of the drain region 150, thereby reducing the punch through effect. Accordingly, the lightly n-doped (N−) second portion of the drain region 150 acts to increase the breakdown voltage of the striped trench MOSFET 100.

The channel width of the trench MOSFET 100 is a function of the lateral length of the plurality of the source regions 120. The channel width increases as the cell density is increased. The channel length of the trench MOSFET is a function of the vertical depth of the body region 145. Thus, the channel width to length ratio increases as the cell density of the trench MOSFET 100 is increased, which results in a decreased drain-to-source on-resistance (Rdson) during the on state of the device. Therefore, the trench MOSFET may advantageously be utilized for power MOSFET applications, such as switching elements in a pulse width modulation (PWM) voltage regulator.

Figure 2A:
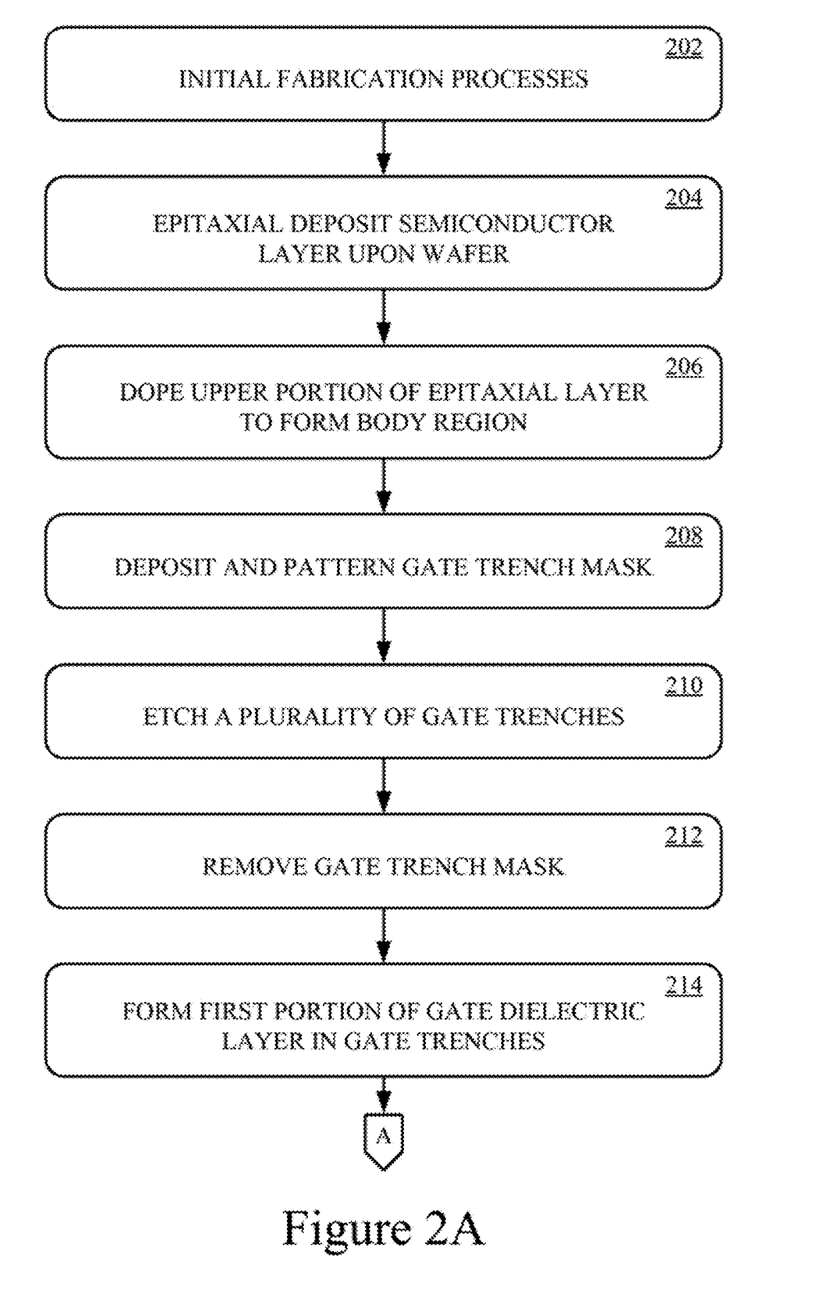
FIGS. 2A-2D show a flow diagram of a method of fabricating a trench MOSFET, in accordance with one embodiment of the present technology.
Figure 2B:
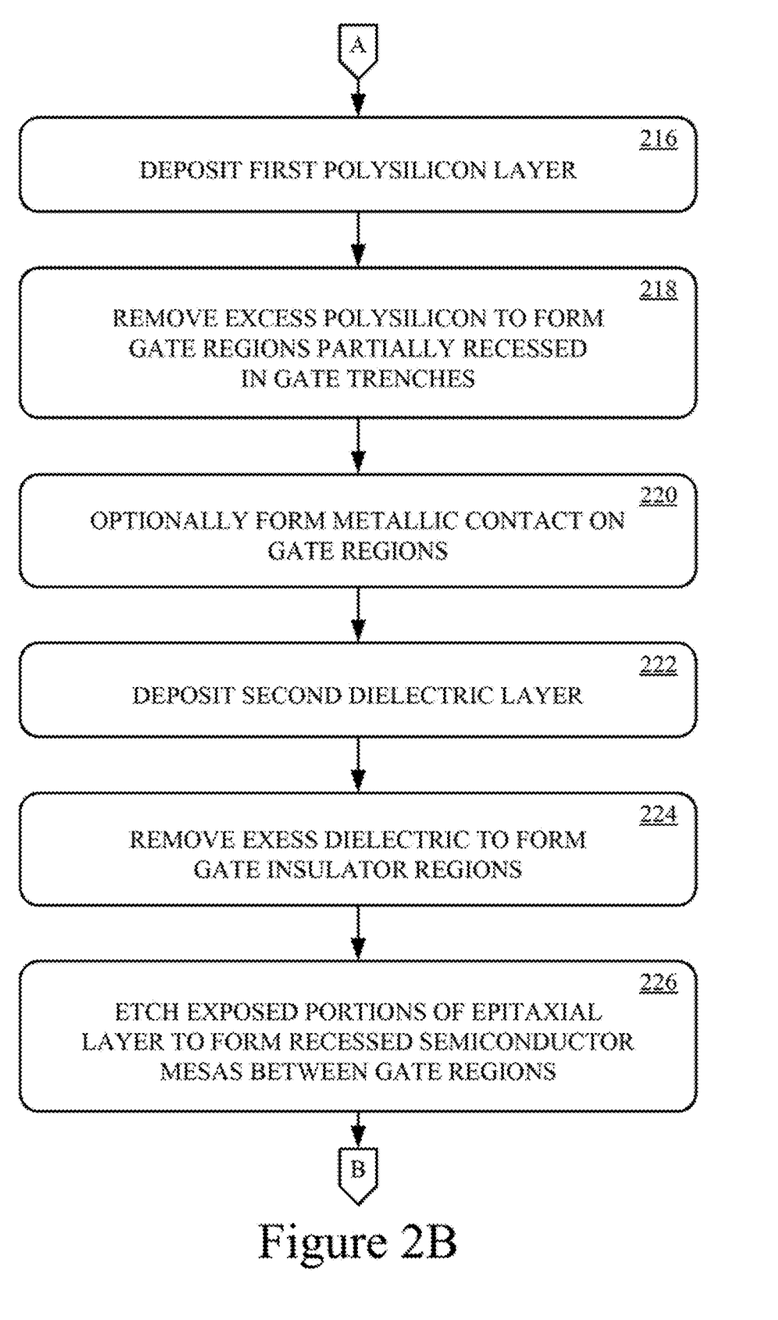
Figure 2C:
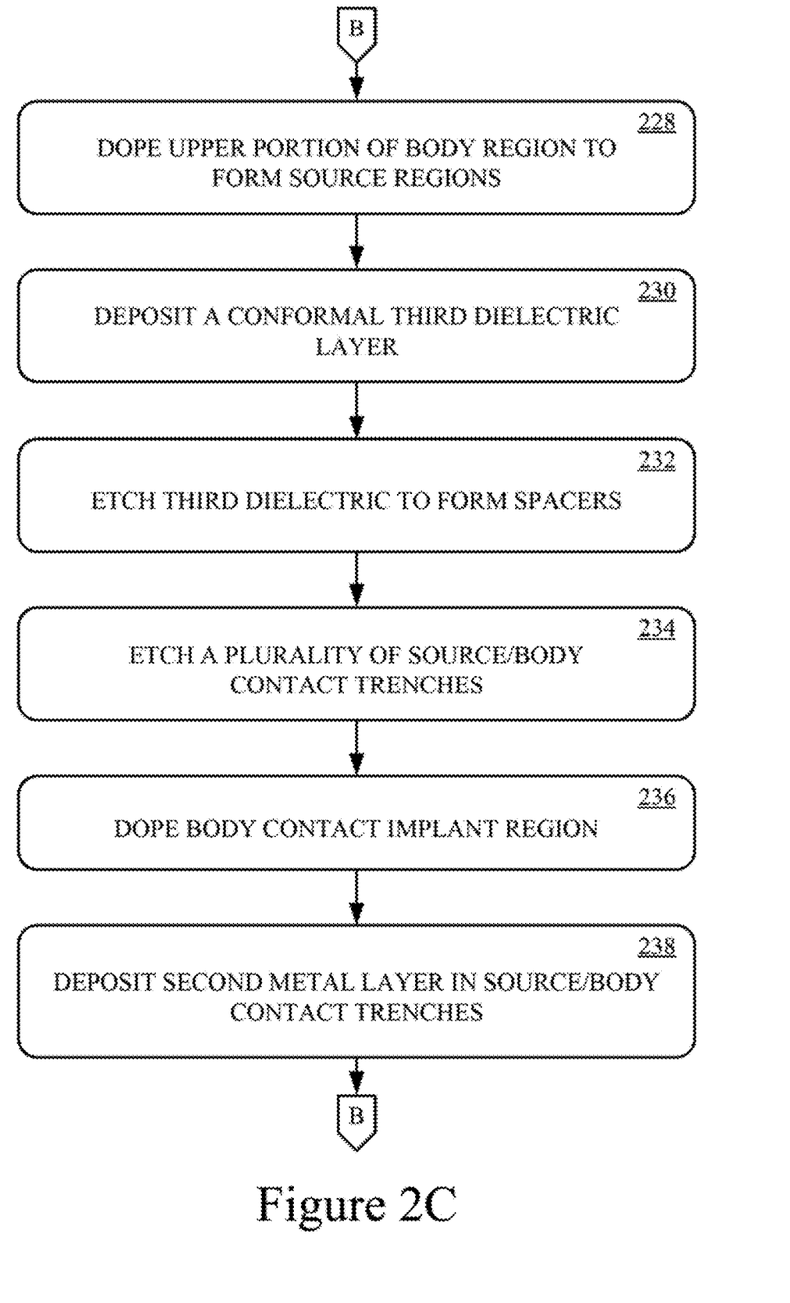
Figure 2D:
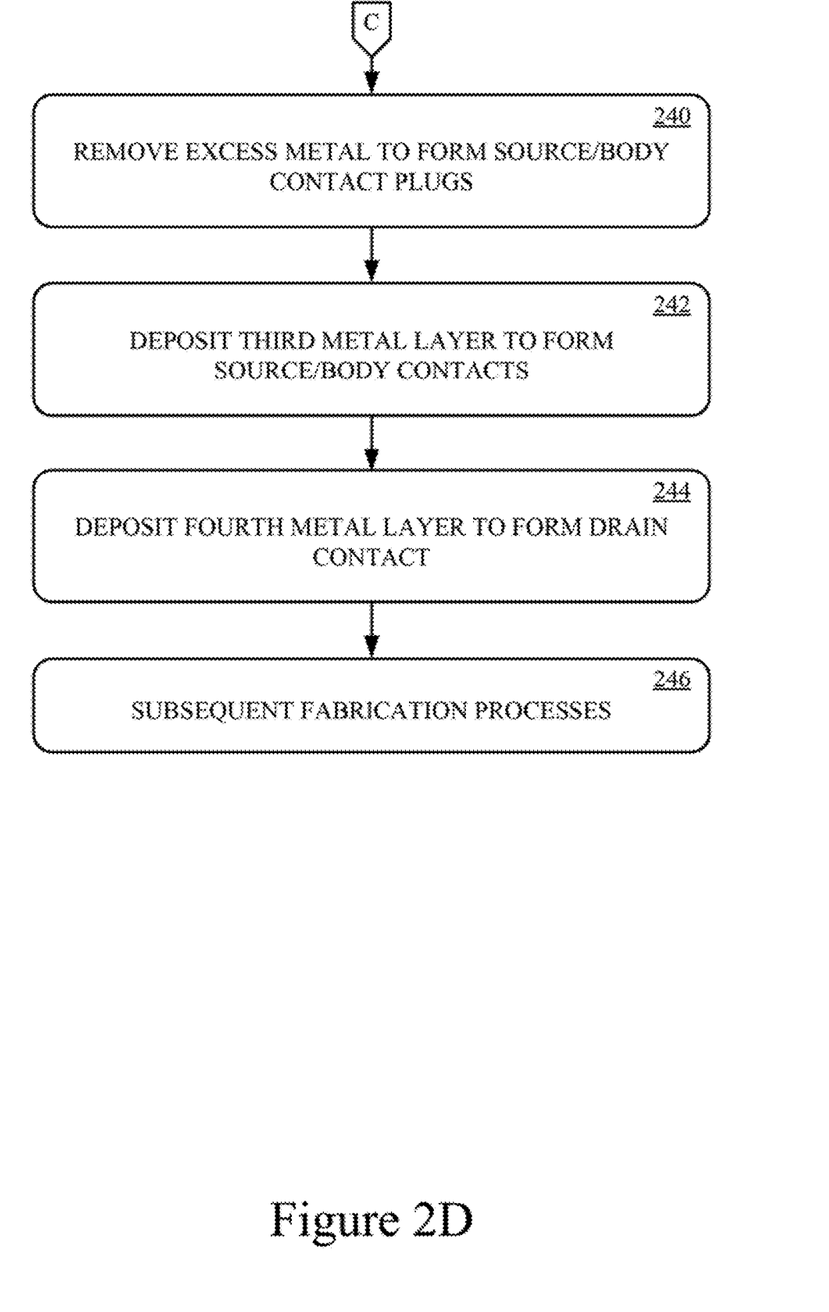
Figure 3A:
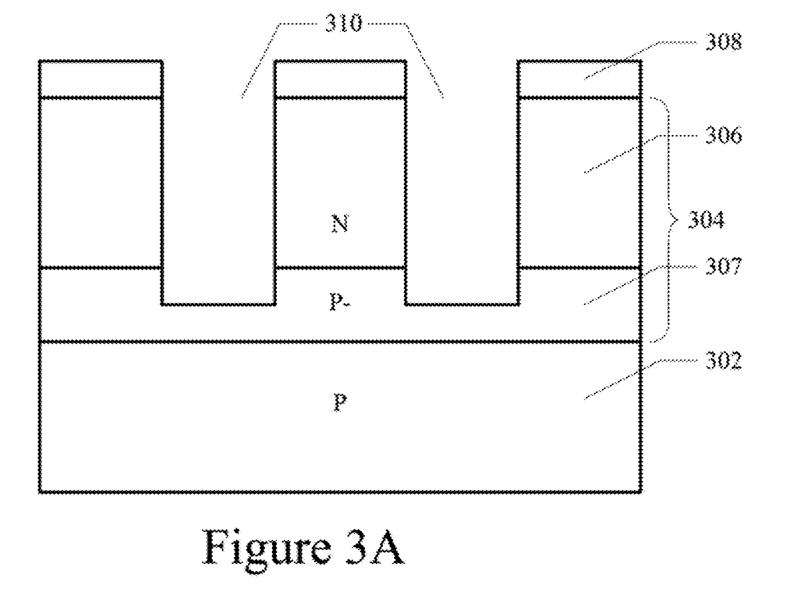
FIGS. 3A-3M show a cross-sectional view of various phases of fabricating a trench MOSFET, in accordance with one embodiment of the present technology.

Referring now to FIGS. 2A-2D, a flow diagram of a method of fabricating a trench MOSFET, in accordance with one embodiment of the present technology, is shown. The method of fabricating the trench MOSFET is illustrated in FIGS. 3A-3M. As depicted in FIGS. 2A and 3A, the process begins, at 202, with various initial processes upon a substrate 302, such as cleaning, depositing, doping, etching and/or the like. In one implementation, the substrate 302 comprises silicon heavily doped with a first type of impurity (e.g., boron (P+)). It is appreciated that the semiconductor substrate 302 will substantially form a drain region of the trench MOSFET upon completion of the fabrication process.

At 204, a semiconductor layer 304 is epitaxial deposited upon the substrate 302. In one implementation, the epitaxial layer may be silicon lightly doped with the first type of impurity (e.g., boron (P−)). The epitaxial deposited silicon 304 may be doped by introducing the desired impurity into the reaction chamber. At 206, the upper portion of the epitaxial layer 304 is doped with a second type of impurity (e.g., phosphorous (N)). It is appreciated that the upper portion of the epitaxial layer 304 will substantially form a body region and the lower portion will substantially form a drift region of the trench MOSFET upon completion of the fabrication process.

At 208, a photo-resist is deposited and patterned by any-well know lithography process to form a gate trench mask 308. At 210, the exposed portions of the epitaxial layer are etched by any-well known isotropic etching method to form a plurality of gate trenches 310. In one implementation, an ionic etchant interacts with the epitaxial layer exposed by the patterned resist layer. The gate trenches extend through the upper portion 306 and partially into lower portion 307 of the epitixial layer 304. In one implementation, a plurality of substantially parallel trenches are formed. In another implementation, a plurality of trenches are formed such that a first set of trenches are substantially parallel to each other and a second set of trenches are substantially normal-to-parallel with respect to the first set of trenches.

Figure 3B:
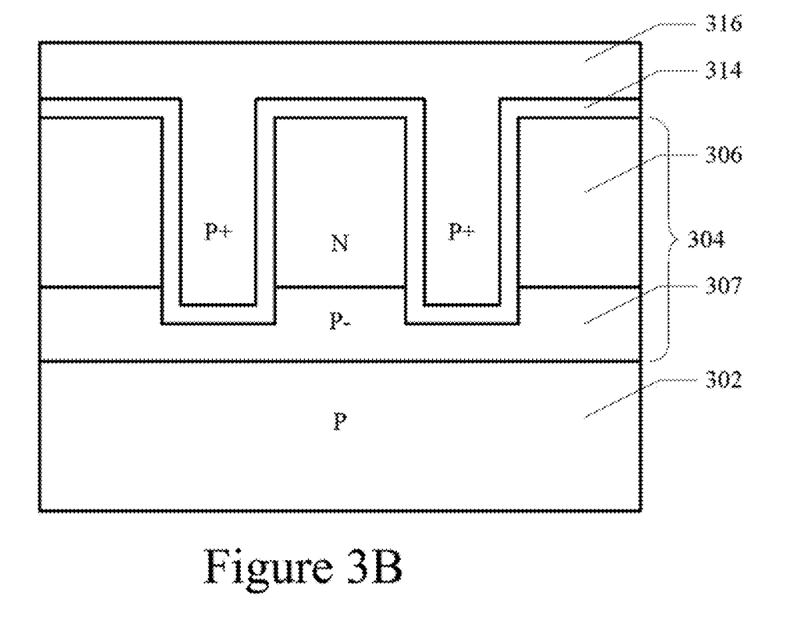
Figure 3C:
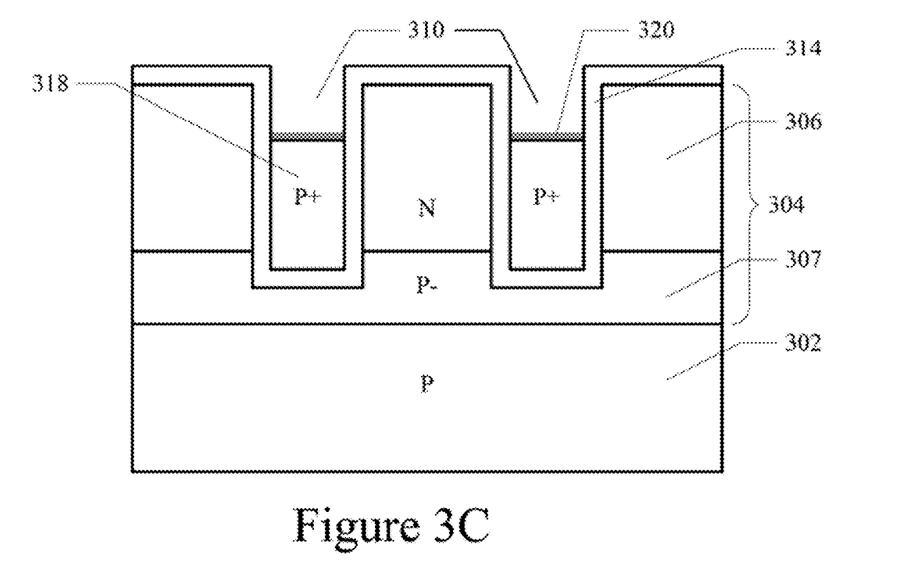

Referring now to FIG. 3B, the gate trench mask 308 is removed utilizing an appropriate resist stripper or a resist ashing process, at 212. At 214, a dielectric layer 314 is formed. In one implementation, the dielectric is formed by oxidizing the surface of the silicon to form a silicon dioxide layer. The resulting dielectric layer 314 along the gate trench walls forms a gate region dielectric 114. At 216, a polysilicon layer is deposited. The polysilicon is doped with the first type of impurity (e.g., boron (P+)). In one implementation, the polysilicon is deposited by a method such as decomposition of silane ($SiH_4$). The polysilicon may be doped by introducing the impurity during the deposition process. Referring now to FIG. 3C, excess polysilicon is removed, at 218. The polysilicon may be etched to form gate regions 318 that are partially recessed in the gate trenches 310. At 320, a metal layer 320 may be deposited on the gate regions 318. In one implementation, a metal may be deposited and a thermal anneal may be utilized to form a suicide between the metal and the polysilicon.

Figure 3D:
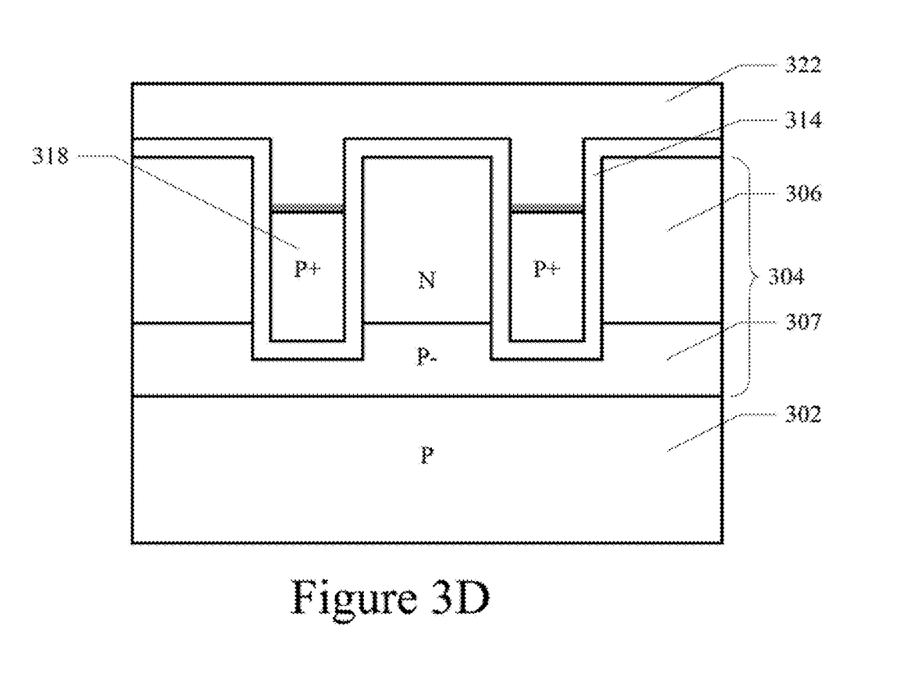
Figure 3E:
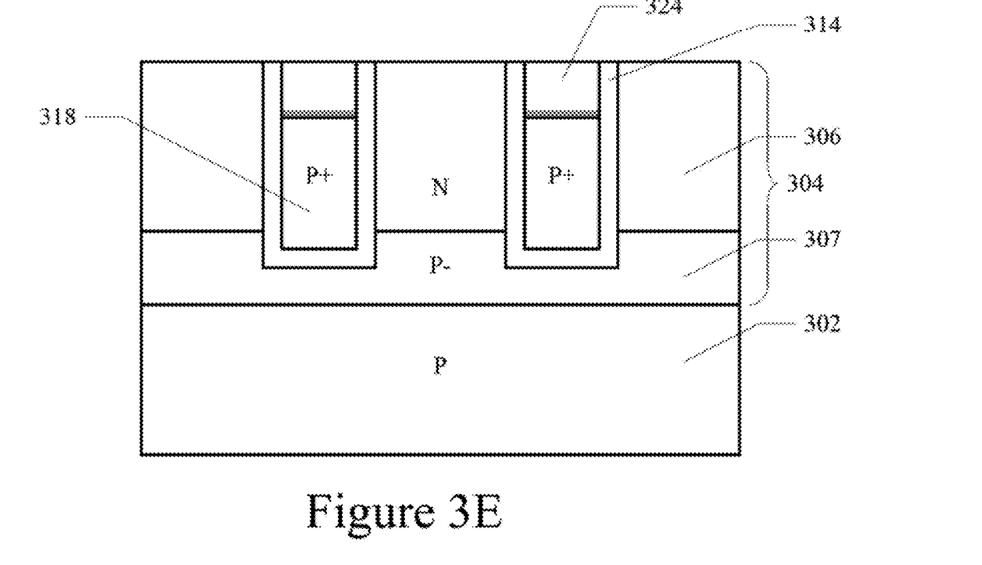

Referring now to FIG. 3D, a second dielectric layer 322 is deposited, at 222. In one implementation, the second dielectric 322 may be an oxide. Referring now to FIG. 3E, excess dielectric is removed until the surface of the epitaxial layer 304 is exposed, at 224. The portion of the second dielectric layer remaining in the recesses above the gate regions 318 forms a field dielectric 324 above the recessed gate regions 318. In one implementation, the excess dielectric layer is removed by chemical-mechanical polishing (CMP). The second dielectric layer and the first dielectric layer are removed until the epitaxial layer 304 between the gate trenches are exposed.

Figure 3F:
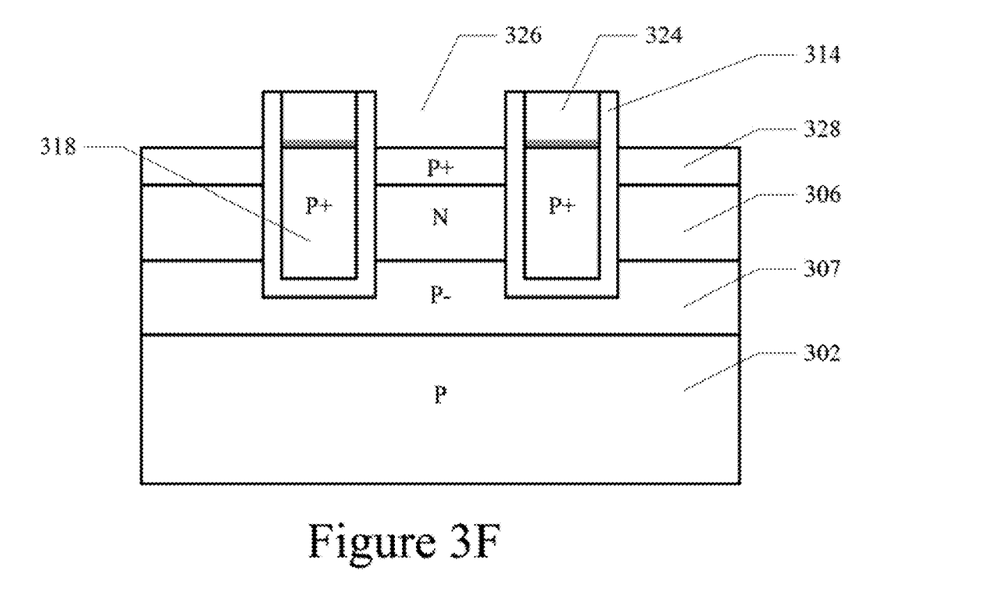

Referring now to FIG. 3F, the exposed portions of the epitaxial layer 304 are etched by any-well known isotropic etching method, at 226. The etching results in a plurality recessed semiconductor mesas 326. Those skilled in the art appreciate that the etching of recessed mesas 326 is a first self-aligned process that utilizes the field dielectric 324 and gate oxide 314 along the walls of the gate trenches 310 as a mask for the self-aligned etch. At 228, the upper portion of the body region 306 is heavily doped with the second type of impurity (e.g., boron (P+)). It is appreciated that the heavily doped portion will substantially form the source regions 328 of the trench MOSFET device.

Figure 3G:
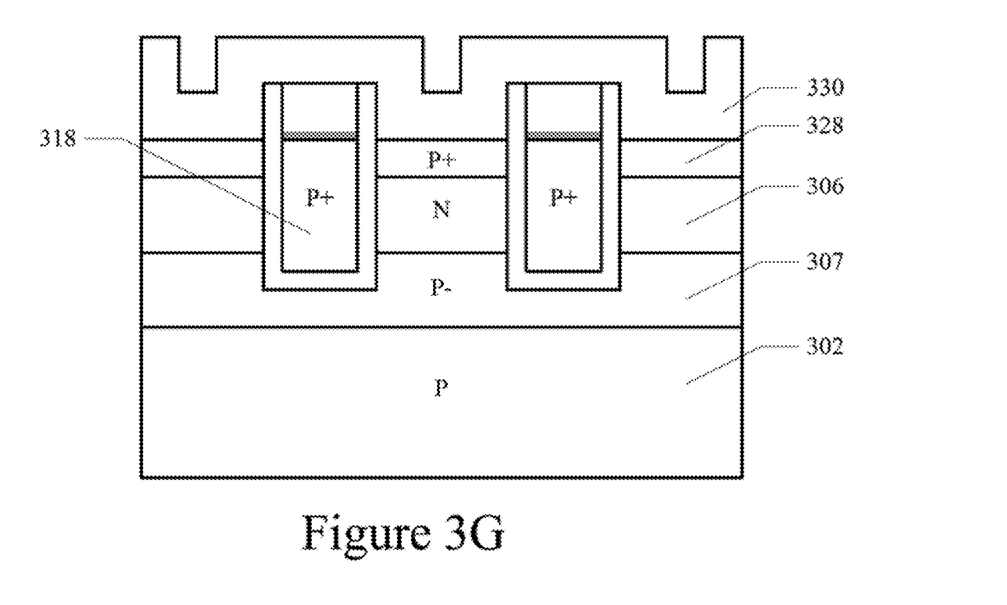
Figure 3H:
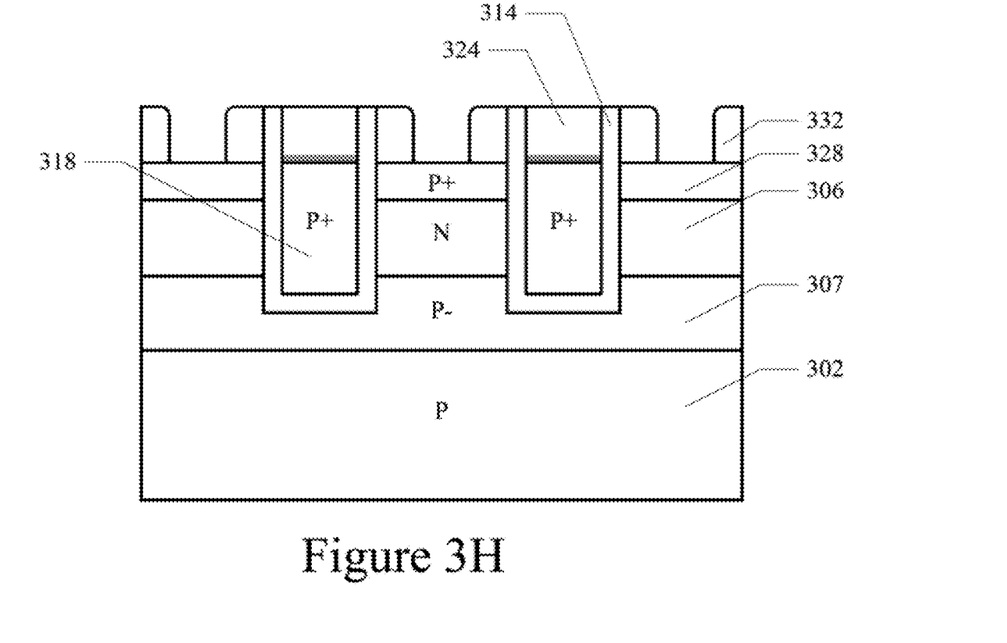

Referring now to FIG. 3G, a third dielectric layer 330 is conformally deposited, at 230. The third dielectric 330 may be an oxide, a nitride or the like. Referring now to FIG. 3H, the third dielectric layer 330 is isotropically etched, at 232. Those skilled in the art appreciate that the isotropic etch of the third dielectric layer 330 will remove the third dielectric layer 330 except for where it was conformally deposited along the vertical sides of the field dielectric/gate oxide 324, 314 thereby forming spacers 332 in the recessed mesas 326 adjacent the field dielectric/gate oxide 324, 314.

Figure 3I:
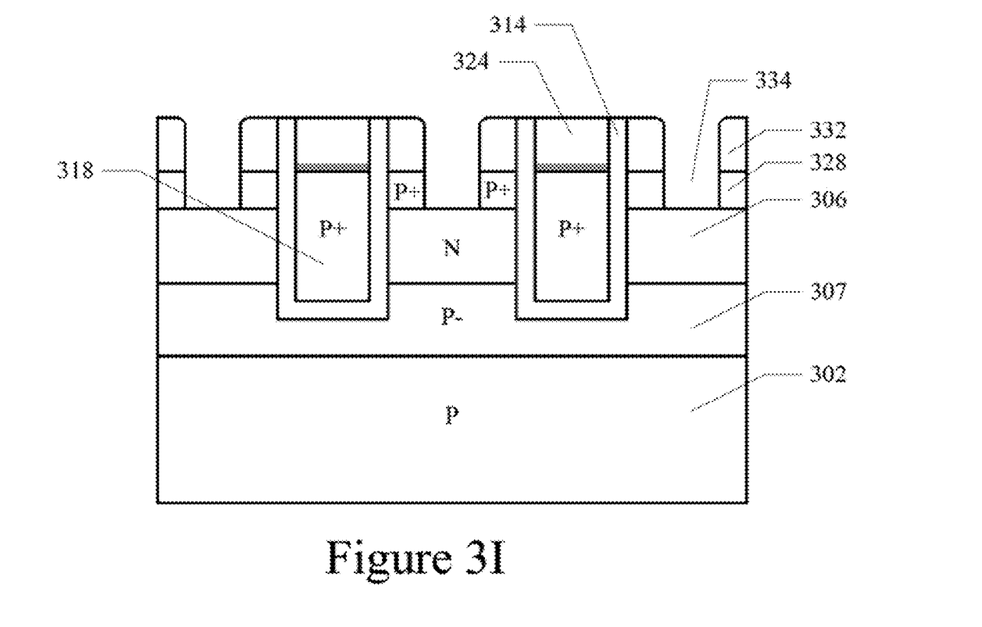

Referring, now to FIG. 3I, the exposed portions of the source regions 328 are etched by any well-known anisotropic etching method, at 234. The etching process is performed until a second plurality of trenches, referred to as source/body contact trenches 334, extend through the source regions 328 to the body regions 306. Those skilled in the art appreciate that the etching of the second plurality of trenches 334 is a second self-aligned process that utilizes the combination of the field dielectric 324, gate oxide 314 and spacers 332 as a mask for the self-aligned etch. In the first implementation, the etching process forms a second plurality of substantially parallel trenches 334 disposed between the striped cell gate regions 318. In the other implementation, the etching process forms a plurality of substantially rectangular trenches disposed in the cells formed by the closed cell gate regions.

Figure 3J:
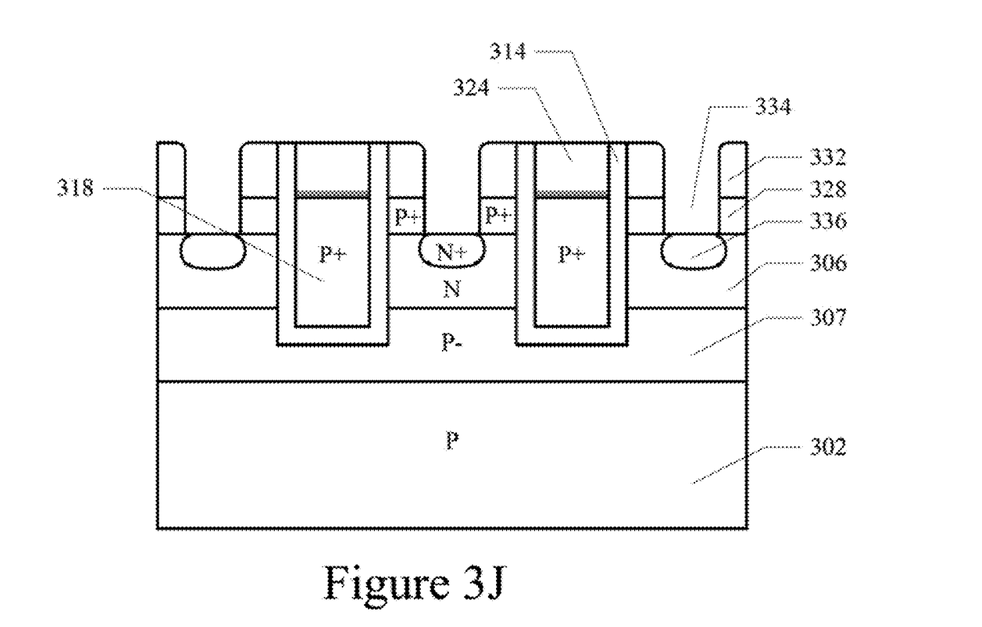

Referring now to FIG. 3J, the exposed portions of the body regions 306 are heavily doped with the second type of impurity (e.g., phosphorous (N+)) to form body contact implant regions 336, at 236. Those skilled in the art appreciate that the implanting of the body contact implant regions 336 is a third self-aligned process that utilizes the combination of the field dielectric 324, gate oxide 314 and spacers 332 as a mask for the self-aligned implant. A thermal cycle ma may be utilized to drive in the body contact implant regions 336.

Figure 3K:
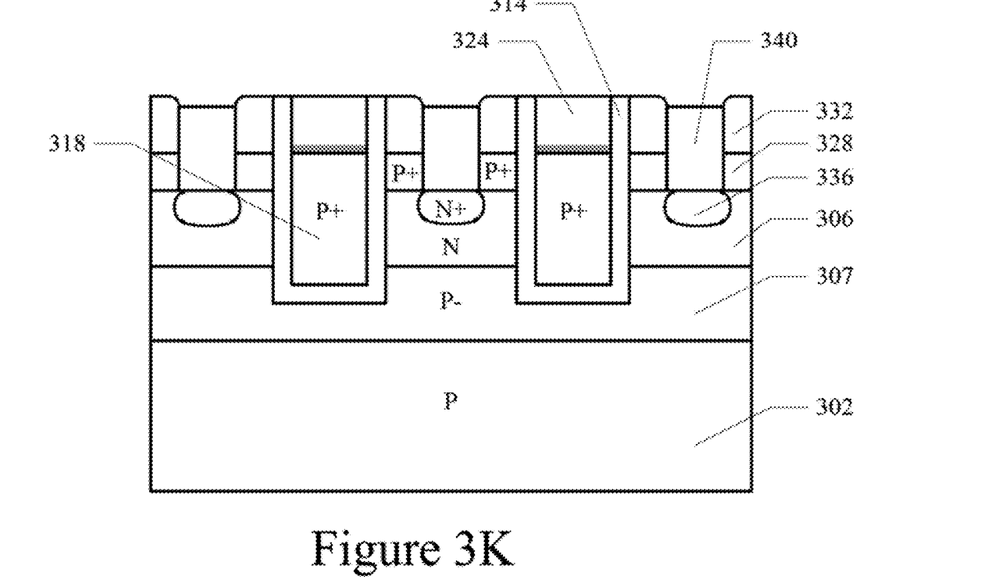

Referring now to FIG. 3K, a second metal layer is deposited in the source/body contact trenches 334, at 238. In one implementation, the metal may be titanium (Ti) titanium nitrate (TiN), tungsten (W), or a multilayer metal such as Ti/TiN/W. At 240, excess metal of the second metal layer is removed to form source/body contact plugs 340 in the source/body contact trenches 334. In one implementation, the second metal layer is chemical-mechanical polished (CMP) to form the source/body contact plugs 340.

Figure 3L:
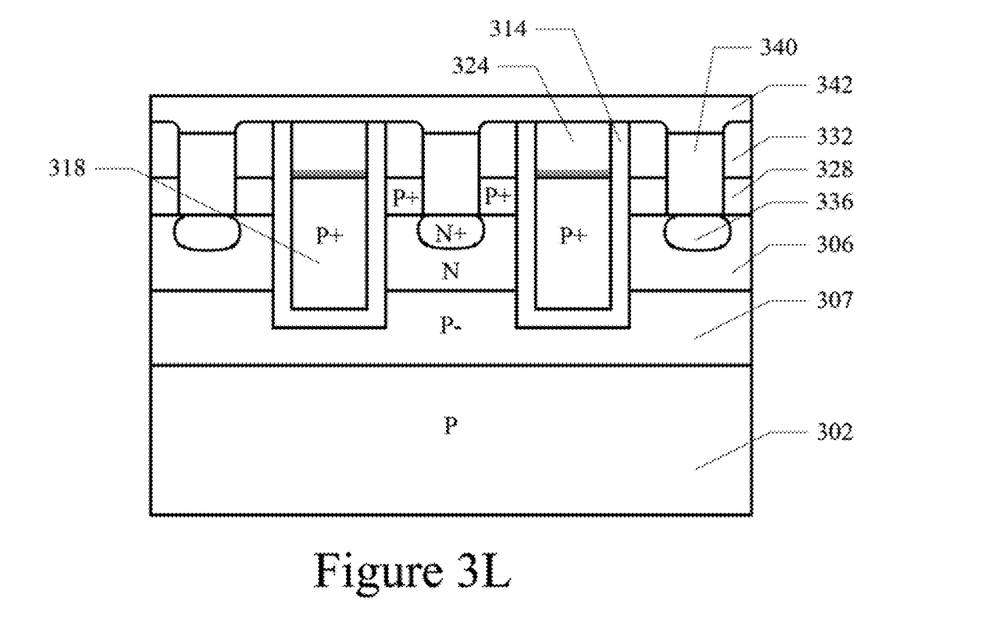
Figure 3M:
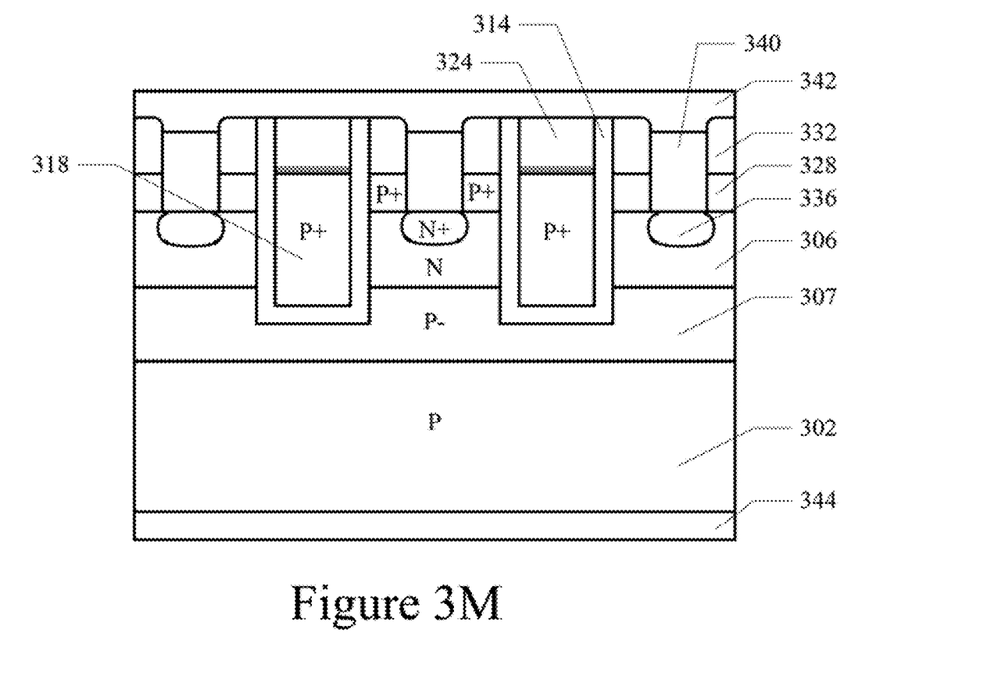

Referring now to FIG. 3L, a third metal layer 342 is deposited, at 242. In one implementation, the metal may be copper (Cu), aluminum (Al) or the like. The third metal layer 342 substantially forms the source/body contact of the trench MOSFET device. Referring now to FIG. 3M, a fourth metal layer 344 is deposited on the backside of the trench MOSFET device, at 244. In one implementation, the metal may be copper (Cu), aluminum (Al) or the like. The fourth metal layer 344 substantially forms the drain contact of the trench MOSFET device. At 246, fabrication continues with various other processes. The various processes typically include etching, depositing, doping, cleaning, annealing, passivation, cleaving and/or the like.

Figure 4:
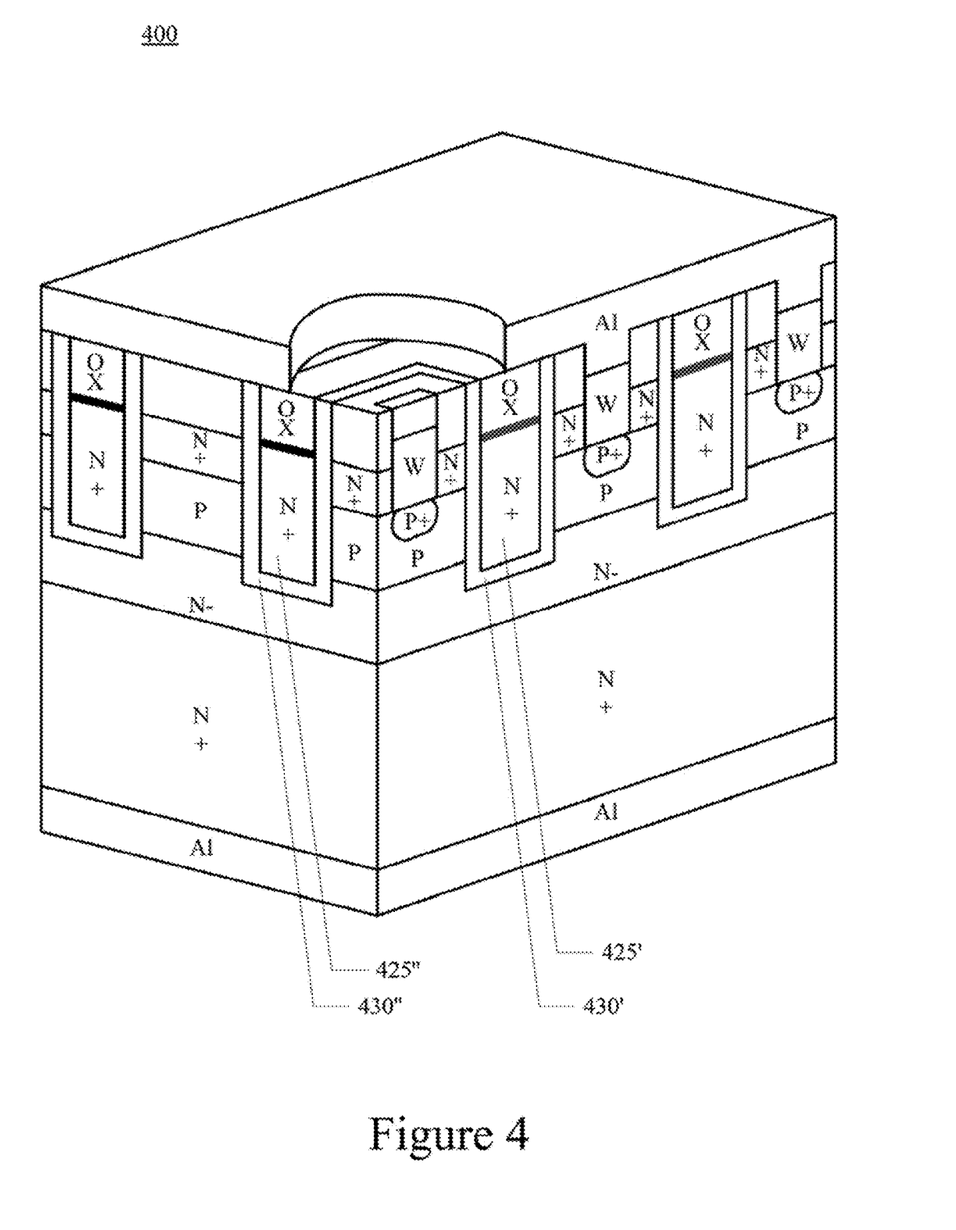
FIG. 4 shows a cross section perspective view of a trench MOSFET, in accordance with another embodiment of the present technology.

Referring now to FIG. 4, a cross sectional perspective view of a trench metal-oxide-semiconductor field effect transistor (MOSFET) 400, in accordance with another embodiment of the present technology, is shown. The structure and operation of trench MOSFET 400 is substantially the same as described above with reference to FIG. 1. FIG. 4, however, illustrates a closed cell structure according to one implementation. The gate region and the gate insulator region may include a first portion formed as a first plurality of substantially parallel elongated structures 425', 430' and a second portion is formed as a second plurality of substantially elongated structures 425", 430" that are substantially perpendicular to the first plurality of substantially parallel elongated structures 425', 430'.

In one implementation, the first type of impurity may be an n-type impurity such as phosphorous and the second type of impurity may be a p-type impurity such as arsenic or boron to form an n-channel MOSFET (N-MOSFET), as illustrated in FIG. 1. In another implementation, the first type of impurity may be a p-type impurity and the second type of impurity may be an n-type impurity to form a p-channel MOSFET (P-MOSFET), as illustrated in FIG. 3M.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the Claims appended hereto and their equivalents.

What is claimed is:

1. A method of fabrication a trench metal-oxide-semiconductor field effect transistor (MOSFET) comprising:
    depositing a first semiconductor layer upon a semiconductor substrate, wherein the first semiconductor layer and the semiconductor substrate are doped with a first type of impurity;
    doping a first portion of the first semiconductor layer with a second type of impurity;
    etching a plurality of trenches in the first semiconductor layer;
    forming a first dielectric layer on the wall of the plurality of trenches;
    depositing a second semiconductor layer in the plurality of trenches;
    forming a second dielectric layer over the second semiconductor layer in the plurality of trenches;
    etching recessed mesas in the first semiconductor layer aligned by the first and second dielectric layers;
    doping a second portion of the first semiconductor layer proximate the recessed mesas with a second type of impurity;
    forming a plurality of source/body contact spacers above the recessed mesas aligned between the second dielectric layer in the trenches;
    etching a plurality of source/body contact trenches between the source/body contact spacers, wherein the source body contact trenches extend through the second portion of the first semiconductor layer;
    doping a third portion of the first semiconductor layer proximate the source/body contact trenches with the first type of impurity aligned by the source/body contact spacers; and
    deposit a first metal layer in the source/body contact trenches aligned to the source/body contact spacers.

2. The method of fabrication a trench metal-oxide-semiconductor field effect transistor (MOSFET) according to claim 1, wherein a first set of the plurality of trenches are substantially parallel with respect to each other and a second set of the plurality of trenches are normal-to-parallel with respect to the first set of the plurality of trenches.

3. The method of fabrication a trench metal-oxide-semiconductor field effect transistor (MOSFET) according to claim 1, wherein the plurality of trenches are substantially parallel with respect to each other.

4. The method of fabrication a trench metal-oxide-semiconductor field effect transistor (MOSFET) according to 1, further comprising forming a silicide on the second semiconductor layer in the plurality of trenches.

5. The method of fabrication a trench metal-oxide-semiconductor field effect transistor (MOSFET) according to 1, wherein forming the second dielectric over the second semiconductor in the plurality of trenches comprises:
    depositing the dielectric layer; and
    removing excess dielectric until the first semiconductor layer is exposed and the second dielectric covers the first semiconductor layer in the plurality of trenches.

6. The method of fabrication a trench metal-oxide-semiconductor field effect transistor (MOSFET) according to 1, wherein forming the plurality of source/body contact spacers comprises:
    conformally depositing a third dielectric layer after doping the second portion of the first semiconductor layer; and
    etching the third dielectric layer whereby the portions of the third dielectric layer substantially remain along vertical sides the second dielectric layer proximate the recessed mesas.

* * * * *